(12) United States Patent
Wieczorek et al.

(10) Patent No.: US 6,821,887 B2
(45) Date of Patent: Nov. 23, 2004

(54) METHOD OF FORMING A METAL SILICIDE GATE IN A STANDARD MOS PROCESS SEQUENCE

(75) Inventors: Karsten Wieczorek, Dresden (DE); Stephan Kruegel, Boxdorf (DE); Manfred Horstmann, Dresden (DE); Thomas Feudel, Radebeul (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 10/391,243

(22) Filed: Mar. 18, 2003

(65) Prior Publication Data

US 2004/0038435 A1 Feb. 26, 2004

(30) Foreign Application Priority Data

Jul. 31, 2002 (DE) .......................... 102 34 931

(51) Int. Cl.[7] .......................... H01L 21/302
(52) U.S. Cl. .......................... 438/664; 438/5; 438/683; 438/592; 438/655; 438/656; 438/660; 438/666; 438/668; 438/685; 438/686
(58) Field of Search .................. 438/592, 655, 438/656, 660, 664, 666, 668, 683, 685, 686, 216, 5, FOR 193, FOR 196

(56) References Cited

U.S. PATENT DOCUMENTS

| 3,912,559 A | * 10/1975 | Harigaya et al. ............ 438/216 |
|---|---|---|
| 4,107,835 A | 8/1978 | Bindell et al. ................. 29/590 |
| 4,897,368 A | 1/1990 | Kobushi et al. ............. 437/200 |
| 5,034,348 A | 7/1991 | Hartswick et al. .......... 437/200 |
| 5,248,892 A | 9/1993 | Van Roozendaal et al. . 257/357 |
| 5,316,977 A | 5/1994 | Kunishima et al. ......... 437/200 |
| 5,317,187 A | 5/1994 | Hindman et al. ........... 257/659 |
| 5,352,631 A | 10/1994 | Sitaram et al. ............. 437/200 |
| 5,447,875 A | 9/1995 | Moslehi ....................... 437/41 |
| 5,451,545 A | 9/1995 | Ramaswami et al. ....... 437/200 |

(List continued on next page.)

FOREIGN PATENT DOCUMENTS

| DE | 19520782 A1 | 12/1995 | ............ H01L/29/43 |
|---|---|---|---|
| DE | 19819438 A1 | 3/1999 | ........ H01L/21/8234 |
| DE | 19750340 A1 | 6/1999 | ......... H01L/27/092 |
| DE | 19952177 A1 | 5/2000 | ......... H01L/21/768 |
| DE | 19940758 A1 | 3/2001 | ......... H01L/21/336 |

(List continued on next page.)

OTHER PUBLICATIONS

Application Ser. No. 10/259,016, entitled "Semiconductor Device Having Different Metal–Semiconductor Portions Formed in a Semiconductor Region and a Method for Fabricating the Semiconductor Device," filed Sep. 27, 2002.

(List continued on next page.)

Primary Examiner—George Fourson
Assistant Examiner—Julio J. Maldonado
(74) Attorney, Agent, or Firm—Williams, Morgan & Amerson, P.C.

(57) ABSTRACT

The polysilicon gate electrode of a MOS transistor may be substantially completely converted into a metal silicide without sacrificing the drain and source junctions in that a thickness of the polysilicon layer, for forming the gate electrode, is targeted to be substantially converted into metal silicide in a subsequent silicidation process. The gate electrode, substantially comprised of metal silicide, offers high conductivity even at critical dimensions in the deep sub-micron range, while at the same time the effect of polysilicon gate depletion is significantly reduced. Manufacturing of the MOS transistor, having the substantially fully-converted metal silicide gate electrode, is essentially compatible with standard MOS process technology.

45 Claims, 2 Drawing Sheets

U.S. PATENT DOCUMENTS

| | | | |
|---|---|---|---|
| 5,565,708 A | 10/1996 | Ohsaki et al. | 257/764 |
| 5,738,917 A | 4/1998 | Besser et al. | 427/576 |
| 5,851,891 A | 12/1998 | Dawson et al. | 438/305 |
| 5,874,342 A | 2/1999 | Tsai et al. | 438/301 |
| 5,899,720 A | 5/1999 | Mikagi | 438/303 |
| 5,902,129 A | 5/1999 | Yoshikawa et al. | 438/592 |
| 5,908,309 A | 6/1999 | Andoh | 438/231 |
| 5,937,325 A | 8/1999 | Ishida | 438/655 |
| 5,998,252 A | 12/1999 | Huang | 438/241 |
| 6,020,242 A | 2/2000 | Tsai et al. | 438/279 |
| 6,040,606 A | 3/2000 | Blair | 257/384 |
| 6,063,681 A | 5/2000 | Son | 438/303 |
| 6,072,222 A | 6/2000 | Nistler | 257/383 |
| 6,100,173 A | 8/2000 | Gardner et al. | 438/592 |
| 6,103,610 A | 8/2000 | Blair | 438/592 |
| 6,133,130 A | 10/2000 | Lin et al. | 438/586 |
| 6,136,705 A | 10/2000 | Blair | 438/682 |
| 6,177,319 B1 | 1/2001 | Chen | 438/275 |
| 6,187,617 B1 | 2/2001 | Gauthier, Jr. et al. | 438/197 |
| 6,204,103 B1 | 3/2001 | Bai et al. | 438/224 |
| 6,232,227 B1 | 5/2001 | Mikagi | 438/655 |
| 6,238,984 B1 | 5/2001 | Yang | 438/275 |
| 6,238,986 B1 | 5/2001 | Kepler et al. | 438/301 |
| 6,261,898 B1 | 7/2001 | Wu | 438/241 |
| 6,268,255 B1 | 7/2001 | Besser et al. | 438/303 |
| 6,268,257 B1 | 7/2001 | Wieczorek et al. | 438/305 |
| 6,281,067 B1 | 8/2001 | Chien et al. | 438/241 |
| 6,297,135 B1 * | 10/2001 | Talwar et al. | 438/592 |
| 6,306,698 B1 | 10/2001 | Wieczorek et al. | 438/197 |
| 6,383,878 B1 | 5/2002 | Huang | 438/299 |
| 6,383,906 B1 | 5/2002 | Wieczorek et al. | 438/592 |
| 6,391,704 B1 | 5/2002 | Hong et al. | 438/241 |
| 6,403,423 B1 | 6/2002 | Weybright et al. | 438/279 |
| 6,451,679 B1 | 9/2002 | Hu et al. | 438/592 |
| 6,468,904 B1 | 10/2002 | Chen et al. | 438/682 |
| 6,528,401 B2 | 3/2003 | Bae et al. | 438/592 |
| 6,528,422 B1 | 3/2003 | Huang et al. | 438/683 |
| 6,531,724 B1 | 3/2003 | Furukawa et al. | 257/288 |
| 6,534,402 B1 | 3/2003 | Liao | 438/659 |
| 6,544,876 B1 * | 4/2003 | Iyer | 438/592 |

FOREIGN PATENT DOCUMENTS

| | | | |
|---|---|---|---|
| EP | 0 199 939 A2 | 12/1986 | H01L/21/285 |
| EP | 0 417 522 A2 | 3/1991 | H01L/21/285 |
| EP | 0 727 815 A3 | 9/1996 | H01L/21/28 |
| JP | 05055251 A | 3/1993 | H01L/21/336 |
| JP | 11-40679 | 2/1999 | H01L/21/8238 |
| JP | 2002025940 A | 1/2002 | H01L/21/28 |
| WO | WO 95/15005 | 6/1995 | H01L/21/285 |
| WO | WO 96/13061 | 5/1996 | H01L/21/283 |
| WO | WO 02/065523 A1 | 8/2002 | H01L/21/28 |

OTHER PUBLICATIONS

Application Ser. No. 10/260,926, entitled "Semiconductor Device Having Different Metal Silicide Portions and Method for Fabricating the Semiconductor Device," filed Sep. 30, 2002.

Application Ser. No.10/282,720, entitled "Method of Forming Different Silicide Portions on Different Silicon–Containing Regions in a Semiconductor Device," filed Oct. 29, 2002.

* cited by examiner

* # METHOD OF FORMING A METAL SILICIDE GATE IN A STANDARD MOS PROCESS SEQUENCE

BACKGROUND OF THE INVENTION

1. Field of the Invention

The present invention generally relates to the manufacture of semiconductor structures, and, more particularly, to the fabrication of MOS transistor devices having gate electrodes with a reduced gate length, especially in the sub 0.25 $\mu$m range.

2. Description of the Related Art

In sophisticated integrated circuits, the feature sizes of circuit elements, such as CMOS (complementary metal oxide semiconductor) transistors, are presently scaled into the deep sub-micron regime for higher integration density and improved device performance. The scaling of critical dimensions, such as the gate length of a MOS transistor, may, however, degrade other related device characteristics so that the advantages obtained by decreasing the feature sizes may partially be offset. For example, the reduction of the gate length, and thus the channel length, of a MOS transistor requires the corresponding scaling of the gate insulation layer that separates the gate electrode from the channel region to provide the required drive current capability for reduced supply voltages that are required to maintain the strength of the electrical field within an acceptable range. Thinning the gate insulation layer, so as to ensure a sufficient capacitive coupling of the gate electrode to the underlying channel region, may allow for compensation of a decreased gate voltage for MOS transistors having a gate length in the range of 0.5 $\mu$m and less. However, severe problems may arise for MOS transistors in the deep sub-micron regime, for example, having a gate length in the range of 0.1 $\mu$m and less, since a plurality of problems render it difficult to provide the desired drive current capability.

One issue of MOS transistors having a gate length in the deep sub-micron range requiring a thickness of the gate insulation layer, usually formed of silicon dioxide, in the range of 2–4 nm resides is the fact that a depletion layer forms within the polysilicon gate electrode. This depletion layer increases the effective thickness of the gate insulation layer and, therefore, reduces the capacitive coupling of the gate electrode to the underlying channel region. Although the formation of the depletion layer may be substantially eliminated by heavily doping the polysilicon gate electrode, it turns out, however, that, in particular for P-channel MOS transistors requiring doping with boron, dopants readily penetrate the gate insulation layer and may also enter the channel region. The former effect may significantly degrade the gate oxide quality of the gate insulation layer, thereby reducing device reliability, whereas the latter effect may lead to a significant shift of the threshold voltage of the transistor device due to the additional dopants introduced into the channel region.

In addition to the formation of a gate depletion layer, especially in P-channel MOS transistors, the polysilicon gate electrode, with reduced gate length, suffers from a reduced conductivity due to the reduced cross-sectional dimension of the gate electrode.

In view of the above problems, great efforts are presently being made to replace the polysilicon with a highly conductive material that allows the elimination, or at least the substantial reduction, of the above identified problems. For instance, metal gate MOS devices have been suggested, and a significantly reduced sheet resistance is obtained, wherein additionally the effect of gate depletion may be substantially eliminated. However, since the vast majority of metals suited for a gate material in MOS applications cannot withstand high temperature thermal process sequences as required in the MOS manufacturing process, such as the rapid thermal annealing for activating implanted dopants and for curing implantation induced lattice damage, complex alternative integration process sequences are required to integrate metal gates into MOS integrated circuits.

In view of the above problems, there exists a need for an improved MOS transistor element that may be manufactured in a compatible fashion with standard MOS manufacturing.

SUMMARY OF THE INVENTION

Generally, according to the present invention, a MOS transistor element may be fabricated using well-established MOS process sequences, wherein, contrary to the conventional approach, a polysilicon layer acting as the gate electrode is substantially completely transformed into a metal silicide so that the sheet resistance and the formation of a gate depletion layer is significantly reduced. By appropriately adjusting the thickness of the polysilicon layer from which the gate electrode is to be patterned, and correspondingly controlling process parameters of a subsequent suicide process, standard process recipes may be effectively employed without compromising integrity of the source and drain junctions.

According to one illustrative embodiment of the present invention, a method of forming a gate electrode of a MOS transistor comprises determining a height of a metal silicide layer of a specified metal formed in a crystalline silicon layer under predefined process conditions. Then, a design height is selected for forming the metal silicide layer in the gate electrode to be formed under the predefined process conditions. Next, a thickness of a metal silicide layer of the specified metal is determined that is formed in a polysilicon layer under the predefined process conditions and the height of the metal silicide layer in the polysilicon layer is selected as a target deposition thickness for forming the gate electrode. Moreover, a substrate is provided having formed thereon a doped silicon region and a gate insulation layer is formed on the doped semiconductor region. Thereafter, a polysilicon gate layer with a thickness corresponding to the target deposition thickness is deposited and patterned to form the gate electrode. A metal layer comprising the specified metal is deposited over the gate electrode and a heat treatment is performed under the specified process conditions to convert polysilicon in the gate electrode into a metal silicide.

According to one illustrative embodiment of the present invention, a method of forming a gate electrode of a MOS transistor comprises determining, as a first target deposition thickness, a thickness of a specified metal layer that is consumed in forming a metal silicide layer of a predefined design height in a crystalline silicon region. The method further includes determining, as a second target deposition thickness, a height of a metal silicide layer of the specified metal that forms in a polysilicon region when the specified metal layer having the first target deposition thickness is substantially completely consumed. The method further comprises providing a substrate having formed thereon a doped semiconductor region and forming a gate insulation layer on the doped semiconductor region. Next, a polysilicon gate layer is deposited on the gate insulation layer with a thickness corresponding to the second target deposition thickness and is patterned to form the gate electrode. Thereafter, a metal layer comprising the specified metal is deposited with a thickness corresponding to the first target deposition thickness. Finally, a heat treatment is performed with the substrate to substantially completely convert the metal layer into metal silicide.

In a further embodiment of the present invention, a MOS transistor comprises a substrate including a well region. A drain region and a source region are formed in the well region and a gate insulation layer is formed adjacent to the well region. Moreover, a gate electrode is formed on the gate insulation layer, wherein at least 90% of the gate electrode is comprised of a metal suicide.

BRIEF DESCRIPTION OF THE DRAWINGS

The invention may be understood by reference to the following description taken in conjunction with the accompanying drawings, in which like reference numerals identify like elements, and in which.

Figure 1A:
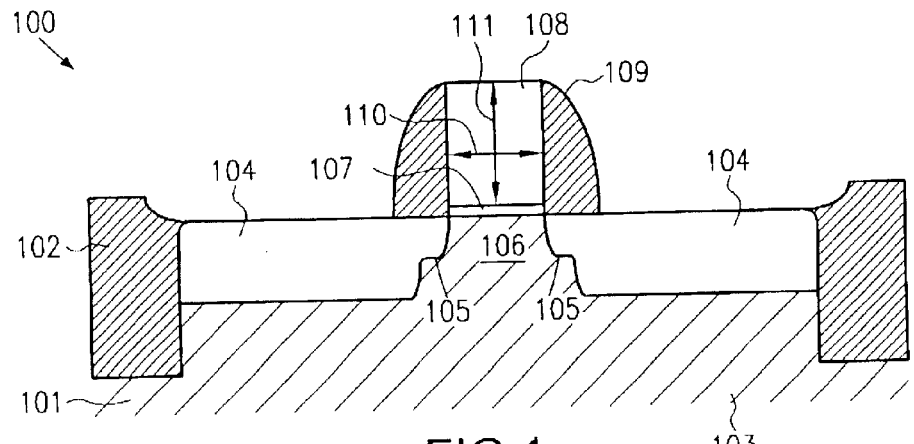
FIGS. 1a–1c schematically show cross-sectional views of a MOS transistor during various stages of manufacturing, which are similar to a conventional MOS process sequence.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

As previously pointed out, the present invention is based on the concept that the process sequences for patterning the polysilicon gate electrode and the process sequence performed at a final state of the transistor formation process, the so-called salicide, i.e., the self-aligned silicidation, may be carried out in close relationship to each other so that a substantially completely silicided gate electrode may be obtained without unduly sacrificing the drain and source junctions. In order to explain illustrative embodiments of the present invention in more detail, first the process steps will be discussed with reference to FIGS. 1a–1c that may also be employed in fabricating a conventional MOS process technique.

FIG. 1a schematically shows a MOS transistor 100 in an advanced manufacturing stage. The transistor 100 comprises a substrate 101, for example in the form of a silicon bulk substrate or an SOI (silicon-on-insulator) substrate, which comprises shallow trench isolations 102 enclosing a doped silicon region 103, which will also be referred to as an active region. In the active region 103, heavily inversely (with respect to the active region) doped source and drain regions 104 are formed, including so-called extension regions 105 that exhibit a dopant concentration which is smaller than that of the source and drain regions 104. An area of the active region 103, located between the lightly doped extension regions 105, is indicated by 106 and is also referred to as a channel region. On the channel region 106, a gate insulation layer 107, that typically comprises silicon dioxide, is formed and separates the active region 103 from a gate electrode 108 comprised of polysilicon. Sidewalls of the gate electrode 108 are covered by sidewall spacers 109 that may be formed of silicon dioxide or silicon nitride and the like. The lateral extension in FIG. 1a of the gate electrode 108, indicated by arrows 110, is usually referred to as gate length, whereas in the present application, the vertical direction is denoted as height direction and a height of the gate electrode 108 is indicated by arrows 111.

As previously pointed out, the present invention is especially advantageous in the context of extremely reduced feature sizes and a typical gate length may thus range from about 0.15–0.05 µm. For example, for a gate length of approximately 0.1 µm, a conventional gate height 111 is typically approximately 0.2 µm.

A typical process flow for forming the transistor 100, as shown in FIG. 1a, may comprise the following steps. First, the shallow trench isolations 102 are formed by anisotropically etching trenches into the substrate 103 and subsequently filling the trenches with an insulating material, such as silicon dioxide. Next, the resulting structure is planarized by chemical mechanical polishing (CMP) and any sacrificial layers (not shown) required for forming the shallow trench isolations 102 are then removed. Subsequently, the active region 103 is formed by performing a plurality of implantation steps to obtain a desired dopant profile in the height direction. Thereafter, the gate insulation layer 107 is formed, which in the present case is of a thickness in the range of 2–4 nm, and sophisticated growth and/or deposition techniques are necessary to provide the gate insulation layer 107 with the required quality and thickness. Next, a layer of polysilicon is deposited on the substrate 101 with a thickness that is targeted to obtain the desired height 111 of the gate electrode 108. Patterning of the deposited polysilicon layer requires highly sophisticated lithographic and etch techniques to obtain the gate electrode 108 having a gate length far beyond the optical resolution of the photolithography tool used. Thereafter, a first implantation step is carried out to form the extension regions 105 and, subsequently, the sidewall spacers 109 are formed by conformally depositing a silicon dioxide or a silicon nitride layer of appropriate thickness and anisotropically etching the layer to finally obtain the spacer elements 109. In a further implantation step, the heavily doped source and drain regions 104 are created, wherein at the same time the gate electrode 108 is also heavily doped and wherein the spacer elements 109 act as implantation masks to protect the extension regions 105.

As previously explained, in view of the high conductivity of the gate electrode 108 and with respect to minimizing any gate depletion layer that forms in the gate electrode 108 during transistor operation, it would be desirable to adjust the implantation parameters, such as dose and energy, so as to heavily dope the gate electrode 108 substantially throughout the entire height 111 of the gate electrode 108. As previously noted, however, damage to the gate insulation layer 107 by penetrating dopant atoms and locating additional dopants in the channel region 106 would lead to a significant transistor deterioration. Accordingly, very strict process requirements have to be met regarding the implantation sequence and also the following rapid thermal anneal treatment to activate the dopants in the source and drain regions 104 and the extension regions 105 and to cure any lattice damage generated by the ion bombardment. Consequently, the dopant concentration in the gate electrode 108, in an area near the gate insulation layer 107, may show a gradual decrease and may thus be the reason for gate depletion during transistor operation.

Figure 1B:
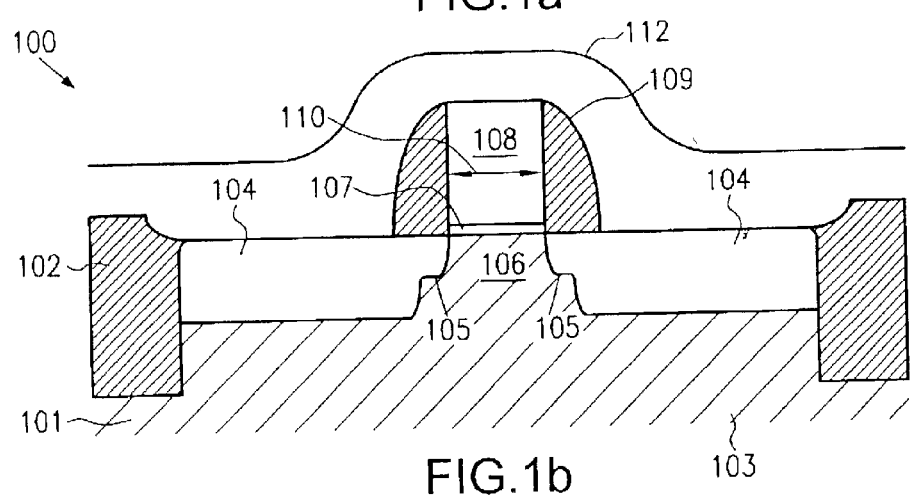

FIG. 1b schematically shows the transistor 100 with a metal layer 112 formed thereon. The metal layer 112 may comprise a refractory metal, such as tungsten, tantalum, molybdenum and the like, or the metal layer 112 may comprise Group VIII metals, such as platinum, palladium, cobalt, nickel, and the like. The metal layer 112 is provided to form, in a subsequent heat treatment, a metal silicide compound with underlying silicon in the drain and source regions 104 and in the gate electrode 108. The metal silicide compound shows a significantly lower sheet resistance than silicon and polysilicon, even if heavily doped, so that a contact resistance to the source and drain regions 104 may be significantly lowered and the overall conductivity of the gate electrode 108 may be increased. Since many of the metals mentioned above exhibit the characteristic of reacting with silicon but substantially do not react with silicon dioxide, the process may be considered "self-aligned," especially as the non-reacted metal may be readily removed selectively to the metal silicide compound and selectively to silicon and silicon dioxide. As the metal silicide compound in the drain and source regions 104 and the gate electrode 108 is to be formed in a common anneal treatment in view of process complexity, an extension in the height direction of the metal silicide region to be formed is limited by the requirement for shallow junctions in the source and drain regions 104, especially in highly sophisticated transistor elements, because scaling the gate length 110 also requires a corresponding scaling of the source and drain regions 104 in the height direction. Thus, only relatively shallow metal silicide regions may be formed in the source and drain regions 104 so that process parameters of the subsequent heat treatment are selected to adjust the resulting metal silicide region in the source and drain regions 104 in accordance with these requirements.

Figure 1C:
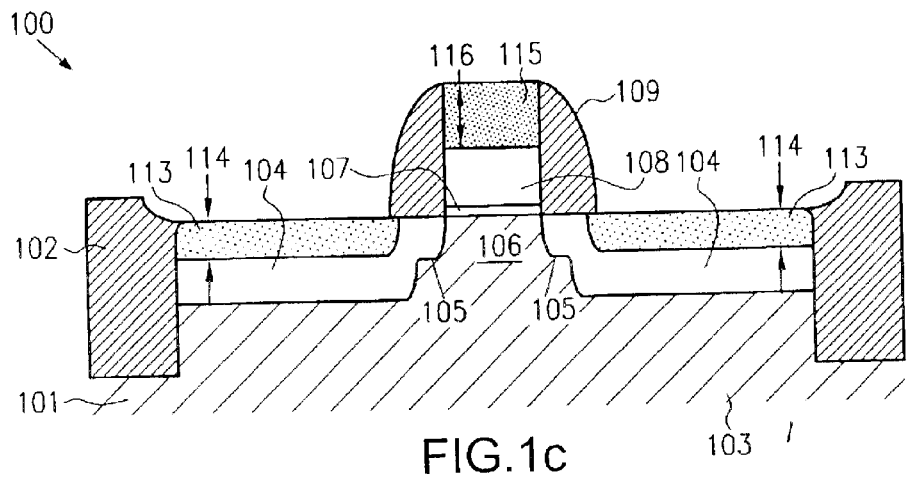

FIG. 1c schematically shows the transistor 100 after completion of a heat treatment to form metal silicide regions 113 in the drain and source regions 104, having a dimension 114 along the height direction in accordance with design requirements. Also, in the gate electrode 108, a,metal silicide region 115 has been formed that exhibits a dimension 116 along the height dimension.

Typically, a rapid thermal anneal process is carried out to initiate a chemical reaction between the metal layer 112 and the underlying silicon. During the heat treatment, the metal diffuses into the underlying silicon and forms the metal silicon compound. Depending on the type of metal used for the metal layer 112, process parameters of the heat treatment have to be properly selected in order to obtain the required dimension 114 in the source and drain regions 104. Frequently, cobalt is used for the metal layer 112, wherein in a first anneal step a cobalt silicon compound is produced and subsequently the non-reacted excess cobalt is removed by a selective wet etch process. Thereafter, a second heat treatment, for example, a second anneal step with a higher temperature than in the first heat treatment, is carried out to transform the cobalt silicon compound into a low-ohmic cobalt disilicide. Thus, in this processing that may be employed in forming a conventional transistor, process parameters such as temperature and duration of the heat treatment are adjusted in conformity with the type of metal in the metal layer 112 to finally yield the metal silicide regions 113 having the required height dimension 114.

In highly sophisticated transistors, having a gate length 110 of 0.1 µm and even less, the height dimension 114 may be in the range of approximately 40–60 nm. Since the metal silicide region 115 in the gate electrode 108 is formed during the same heat treatment, the height dimension 116 is also determined by the same process parameters, wherein, typically, the height dimension 116 may be significantly larger than the height dimension 114. It is believed that the different diffusion behavior of the metal in the polysilicon of the gate electrode 108 and the crystalline silicon in the drain and the source regions 104 allows the metal of the layer 112 to react more rapidly with the polysilicon than with the crystalline silicon. Although a thicker metal silicide region 115 is formed in the gate electrode 108, compared to the metal silicide regions 114 in the source and drain regions 104, the problem of reduced conductivity of the gate electrode 108 still remains, especially as the lower portions of the gate electrode 108, having a reduced dopant concentration, may not be converted in a highly conductive metal silicide. In particular, the problem of creating a gate depletion layer upon transistor operation is substantially unaffected by the metal suicide formation described above and leads to a higher effective thickness of the gate insulation layer 107 and, thus, to a reduced capacitive coupling of the gate electrode 108 to the under-lying channel region 106.

In addition to the process sequence described above, the present invention employs the concept of substantially completely converting the polysilicon of the gate electrode 108 into a metal silicide, wherein, in view of process efficiency, the well-established process sequence described with reference to FIGS. 1a–1c, may be substantially maintained.

Again referring to FIG. 1a, the process sequence described for forming the transistor element 100, as shown in FIG. 1a, is carried out in relationship with the silicidation process described in FIGS. 1b–1c. Upon patterning the gate electrode 108, a polysilicon layer is deposited with a target deposition thickness that allows a height 111 of the gate electrode 108 to be obtained that may be substantially completely converted into a metal silicide. After patterning the gate electrode 108, the further processing may be carried out as already described with reference to FIG. 1a.

The target deposition thickness of the polysilicon layer depends on the type of metal and on process-inherent characteristics. The desired height 114, also referred to as design height, of the metal silicide regions 113 may be selected in conformity with design requirements. The corresponding actual height 114 and the associated height 116 on the gate electrode 108 may then be determined by a test run or by data analysis of devices manufactured according to the sequence described with reference to FIGS. 1a–1c. Moreover, the dependency of process parameters, such as temperature and duration of the heat treatment for converting silicon into a silicide for metals of interest, may be obtained empirically or theoretically.

In depositing the metal layer 112, as shown in FIG. 1b, a thickness of the metal layer 112 is selected to allow the substantially complete conversion of polysilicon into a metal silicide. For example, converting a 70 nm thick silicon layer into a cobalt silicide requires a cobalt layer thickness of approximately 20 nm. Thus, in one embodiment of the present invention, the metal layer 112 is substantially conformally deposited, for example by sputter deposition, with a thickness that substantially corresponds to a thickness that allows the substantially complete conversion of the polysilicon in the gate electrode 108 into a metal silicide. Since the height 111 of the gate electrode 108 is selected to substantially correspond to the height dimension 116 of the metal silicide region 115 that would be obtained according to conventional processing, it is thus ensured that the height dimension 114 of the metal silicide regions 113, that will form in the subsequent heat treatment, is substantially equal to the transistor 100 shown in FIG. 1c.

By depositing the metal layer 112 with the minimum required thickness, the influence of the remaining process parameters of the heat treatment is minimized as long as it is guaranteed that all of the metal is consumed.

In a further illustrative embodiment of the present invention, the thickness of the metal layer 112 is selected to exceed the minimum thickness required for completely converting the polysilicon into a metal silicide and, instead of controlling the degree of metal silicide formation by adjusting the thickness of the metal layer 112, the process parameters of the subsequent heat treatment are precisely controlled, similarly as in the processing as described above, to obtain the required height dimension 114 of the metal silicide regions 113 in the source and drain regions 104, wherein the reduced height 111 of the gate electrode 108 again leads to a substantially complete conversion of the polysilicon in the gate electrode 108.

Figure 1D:
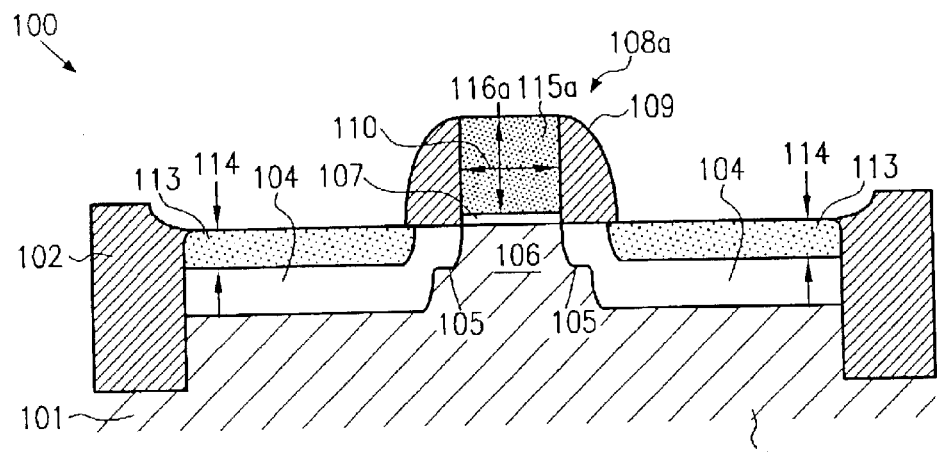
FIGS. 1d–1e schematically show cross-sectional views of MOS transistors according to illustrative embodiments of the present invention, wherein the MOS transistor devices are manufactured in a manner that is compatible with the conventional MOS process sequence.

FIG. 1d schematically shows the transistor element 100 after completion of the heat treatment for the transistor 100 with a polysilicon gate 108a formed in accordance with the above-described target deposition thickness. The source and drain regions 104 comprise the metal silicide regions 113 having substantially the same height dimensions 114. The metal silicide region 115a in the gate electrode 108a exhibits substantially the same height dimension 116 as shown in FIG. 1c, wherein, however, the metal silicide region 115a substantially extends down to the gate insulation layer 107. It should be noted that although the cross-sectional dimension of the gate electrode 108a of FIG. 1d is significantly reduced to the device shown in FIG. 1c, the reduction in cross-section is overcompensated by the remarkably higher conductivity of the metal silicide compared to the doped polysilicon. In particular, the relatively low doped areas in the lower portion of the gate electrode 108 of the transistor 100 of FIG. 1c are substantially eliminated, so that the overall conductivity of the gate electrode 108a, including the metal silicide region 115a, is remarkably higher than in the gate electrode 108.

Moreover, a formation of a depletion layer in the gate electrode 108a may be drastically reduced, depending on the magnitude of the dimension 116a, i.e., depending on the degree of conversion of polysilicon into metal silicide. In one typical example of the transistor 100 having the gate electrode 108a, the gate length 110 is approximately 50 nm, the height dimension 116a is in the range of approximately 70–80 nm and the height dimension 114 of the metal silicide regions 113 is in the range of approximately 30–40 nm. As previously noted, the desired height dimension 114 of the metal silicide regions in the drain and source regions 104 strongly depends on the critical gate length 110 so that the above values have to be adapted to the desired critical dimension of the gate length 110 for other transistor devices. Moreover, the above illustrative example relates to cobalt as the metal in the metal layer 112, and the height dimension 114 of the metal silicide regions 113 may be selected in accordance with the required contact resistance obtained by the respective metal. For example, cobalt silicide has a typical sheet resistance of approximately 16–18 $\mu\Omega$cm and, in addition to the requirements of the shallow drain and source junctions, the required contact resistance may also be a dominant factor in selecting the height dimension 114 of the metal silicide regions 113. If, therefore, design requirements necessitate a smaller height dimension 114 while still maintaining a required low contact resistance, an appropriate metal having a lower sheet resistance is to be selected and the initial polysilicon layer thickness in the height dimension is to be adapted to obtain a substantially complete conversion of the polysilicon in the gate electrode 108a. For example, titanium silicide may have a slightly lower sheet resistance in the range of approximately 13–20 $\mu\Omega$cm and may be used instead of cobalt for providing a lower sheet resistance. Since titanium usually consumes approximately 25% less silicon than cobalt, the corresponding height of the gate electrode 108a has to be selected by taking into account this difference and, therefore, the height dimension 116a may be approximately 25% less than that of a cobalt silicide region. Moreover, if titanium is used, or if other metals are used that exhibit reducing characteristics such as zirconium, an additional barrier layer may be provided on top of the gate insulation layer, usually comprising silicon dioxide, to avoid interactions between the silicide and the silicon dioxide of a gate insulation layer.

Figure 1E:
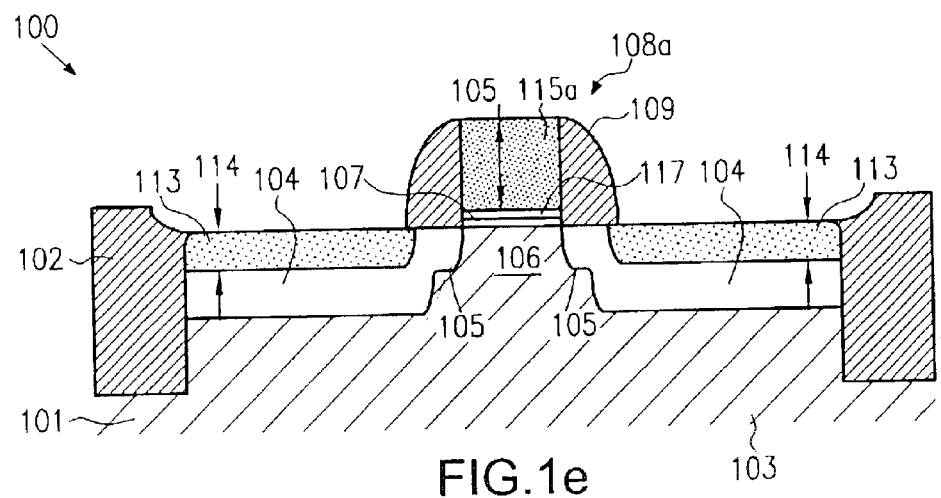

FIG. 1e schematically shows the transistor element 100 with a barrier layer 117 formed on the gate insulation layer 107. The barrier layer 117 may comprise a material that does not substantially react with the metal silicide in the region 115a to thereby maintain the integrity of the gate insulation layer 107. For example, the barrier layer 117 may comprise silicon nitride that does not substantially react with titanium silicide, zirconium silicide and the like. In other embodiments, the barrier layer 117 may be comprised of a highly conductive material, such as metal-containing layers as used, for instance, as barrier metal layers in forming metal plugs (not shown) to the source and drain regions 104, or during the fabrication of metallization layers for electrically connecting individual circuit elements or groups of circuit elements. For example, the barrier layer 117 may be comprised of titanium, titanium nitride, tantalum, tantalum nitride, and the like. Especially the nitrides of titanium and tantalum form an effective barrier that does not substantially react with silicon dioxide and a plurality of metal silicides, such as cobalt silicide. By providing the barrier layer 117 as a highly conductive layer, the capacitance of the gate insulation layer 107 remains substantially unaffected so that the process sequence for forming the gate insulation layer 107 does not need to be changed and the formation of the barrier layer 117 is substantially completely compatible with the preceding processes. Moreover, the metal-containing barrier layer 117 does not substantially contribute to the formation of a depletion layer in the vicinity of the gate insulation layer 107.

In embodiments employing a dielectric material for the barrier layer 117, such as silicon nitride, a thickness of the barrier layer 117 in combination with the thickness of the gate insulation layer 107 may be selected to obtain the required capacitance of the gate dielectric now formed by the combination of the layers 107 and 117. For instance, the barrier layer 117 may exhibit a higher dielectric constant than the underlying gate insulation layer 107, which in this case is formed with a reduced thickness so that a part of the initial layer 107 may be replaced by the dielectric of the barrier layer 117 having the higher dielectric constant. Since the dielectric constant is higher for the barrier layer 117, the "replacement" layer may have a greater thickness then the portion of the layer 107 to be replaced, while still providing the same or even an increased capacitance.

Thus, reducing the thickness of the gate insulation layer 107, upon growing or depositing the layer 107 and a subsequent formation of the barrier layer 117, may lead to an effective gate dielectric that may have a larger thickness but quite similar dielectric characteristics, in view of the capacitive coupling, than a single very thin gate insulation layer 107 comprised of silicon dioxide. At the same time, reducing metals such as titanium, zirconium and the like may be used in forming the metal silicide region 115a, wherein the increased actual thickness of the combined gate dielectric 107, 117 additionally reduces leakage currents during transistor operation and reduces the penetration of dopant atoms through the gate dielectric 107, 117 while heavily doping the gate electrode 108a in forming the drain and source regions 104.

As a result, the present invention allows the formation of a transistor element using conventional MOS techniques, wherein the polysilicon in the gate electrode is, to a high degree or even substantially completely, converted into a metal suicide so that the overall conductivity of the gate electrode is increased and the effect of gate depletion is remarkably reduced.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a gate electrode of a MOS transistor, the method comprising:
    determining a height of a metal silicide layer of a specified metal formed in a crystalline silicon layer under a set of process conditions;
    determining a thickness of a metal silicide layer of said specified metal formed in a polysilicon layer under said set of process conditions and selecting said determined thickness of the metal silicide layer in the polysilicon layer as a target deposition thickness for said polysilicon layer;
    providing a substrate having formed thereon a doped silicon region;
    forming a gate insulation layer on said doped semiconductor region;
    depositing a polysilicon gate layer with a thickness corresponding to said target deposition thickness;
    patterning the polysilicon gate layer to form the gate electrode;
    forming a metal layer comprising said specified metal over the gate electrode; and
    performing at least one heat treatment process under said set of process conditions to convert polysilicon in the gate electrode into a metal silicide.

2. The method of claim 1, wherein performing at least one heat treatment process comprises the sequence:
    performing a first rapid thermal anneal process to form a metal silicon compound in the gate electrode;
    removing non-reacted metal by a selective etch step; and
    performing a second rapid anneal process to convert the metal silicon compound into a metal silicide.

3. The method of claim 1, wherein said specified metal is at least one of a refractory metal and a Group VIII metal.

4. The method of claim 3, wherein said specified metal is at least one of tungsten, tantalum, molybdenum, titanium, cobalt, platinum, palladium, nickel and zirconium.

5. The method of claim 1, wherein a gate length of said gate electrode is in the range of approximately 0.25–0.04 $\mu$m.

6. The method of claim 5, wherein the gate length is in the range of approximately 0.1–0.04 $\mu$m.

7. The method of claim 1, further comprising forming a barrier layer on said gate insulation layer prior to depositing the polysilicon layer.

8. The method of claim 7, wherein said barrier layer is comprised of a material that has a reduced interaction activity with the metal silicide compared to an interaction activity of the gate insulation layer with the metal silicide.

9. The method of claim 7, wherein a dielectric constant of the barrier layer is higher than a dielectric constant of the gate insulation layer.

10. The method of claim 8, wherein said material comprises a metal.

11. The method of claim 8, wherein said material comprises at least one of titanium, tantalum, titanium nitride and tantalum nitride.

12. A method of forming a gate electrode of a MOS transistor, the method comprising:
    determining, as a first target deposition thickness, a thickness of a specified metal layer that is consumed in forming a metal silicide layer having a design height in a crystalline silicon region;
    determining, as a second target deposition thickness, a height of a metal silicide layer of said specified metal that forms in a polysilicon region when said specified metal layer having the first target deposition thickness is substantially completely consumed;
    providing a substrate having formed thereon a doped semiconductor region;
    forming a gate insulation layer on the doped semiconductor region;
    depositing a polysilicon layer on the gate insulation layer with a thickness corresponding to the second target deposition thickness;
    patterning the polysilicon layer to form the gate electrode;
    depositing a metal layer comprising said specified metal with a thickness corresponding to the first target deposition thickness; and
    performing at least one heat treating process on the substrate to substantially completely convert said metal layer into metal silicide.

13. The method of claim 12, wherein performing said at least one heat treating process on the substrate comprises the sequence:
    performing a first rapid thermal anneal process to form a metal silicon compound in the gate electrode;
    removing non-reacted metal by a selective etch step; and
    performing a second rapid anneal process to convert the metal silicon compound into a metal silicide.

14. The method of claim 12, wherein said specified metal is at least one of a refractory metal and a Group VIII metal.

15. The method of claim 14, wherein said specified metal is at least one of tungsten, tantalum, molybdenum, titanium, cobalt, platinum, palladium, nickel and zirconium.

16. The method of claim 12, wherein a gate length of said gate electrode is in the range of approximately 0.25–0.04 µm.

17. The method of claim 16, wherein the gate length is in the range of approximately 0.1–0.04 µm.

18. The method of claim 12, further comprising forming a barrier layer on said gate insulation layer prior to depositing the polysilicon layer.

19. The method of claim 18, wherein said barrier layer is comprised of a material that has a reduced interaction activity with the metal silicide compared to an interaction activity of the gate insulation layer with the metal silicide.

20. The method of claim 19, wherein a dielectric constant of the barrier layer is higher than the dielectric constant of the gate insulation layer.

21. The method of claim 19, wherein said material comprises a metal.

22. The method of claim 21, wherein said material comprises at least one of titanium, tantalum, titanium nitride and tantalum nitride.

23. A method of forming a semiconductor device comprised of a gate electrode and a source region and a drain region, the method comprising:
   determining a first target thickness of a layer of metal to be formed on said source and drain regions to form a metal silicide layer of a desired thickness on said source and drain regions under a set of process conditions;
   forming a gate insulation layer above a semiconductor substrate;
   forming a layer of polysilicon above said gate insulation layer, said layer of polysilicon being formed to a second target thickness such that said layer of metal of said first determined target thickness is substantially consumed under said set of process conditions;
   patterning at least said layer of polysilicon to define said gate electrode;
   forming said source and drain regions in said substrate;
   forming said layer of metal to said determined first target thickness on said gate electrode and said source and drain regions; and
   performing at least one heat treatment process to form said metal silicide layer on said source and drain regions and on said gate electrode.

24. The method of claim 23, wherein said layer of polysilicon is formed to said second target thickness such that substantially all of said layer of polysilicon is consumed when said layer of metal is converted to a metal silicide layer on said gate electrode.

25. The method of claim 23, wherein performing at least one heat treatment process comprises the sequence:
   performing a first rapid thermal anneal process to form a metal silicon compound in the gate electrode;
   removing non-reacted metal by a selective etch step; and
   performing a second rapid anneal process to convert the metal silicon compound into a metal silicide.

26. The method of claim 23, wherein said specified metal is at least one of a refractory metal and a Group VIII metal.

27. The method of claim 26, wherein said specified metal is at least one of tungsten, tantalum, molybdenum, titanium, cobalt, platinum, palladium, nickel and zirconium.

28. The method of claim 23, wherein a gate length of said gate electrode is in the range of approximately 0.25–0.04 µm.

29. The method of claim 28, wherein the gate length is in the range of approximately 0.1–0.04 µm.

30. The method of claim 23, further comprising forming a barrier layer on said gate insulation layer prior to depositing the polysilicon layer.

31. The method of claim 30, wherein said barrier layer is comprised of a material that has a reduced interaction activity with the metal silicide compared to an interaction activity of the gate insulation layer with the metal silicide.

32. The method of claim 30, wherein a dielectric constant of the barrier layer is higher than a dielectric constant of the gate insulation layer.

33. The method of claim 31, wherein said material comprises a metal.

34. The method of claim 31, wherein said material comprises at least one of titanium, tantalum, titanium nitride and tantalum nitride.

35. A method of forming a semiconductor device comprised of a gate electrode and a source region and a drain region, the method comprising:
   determining a first target thickness of a layer of metal to be formed on said source and drain regions to form a metal silicide layer of a desired thickness on said source and drain regions;
   forming a gate insulation layer above a semiconductor substrate;
   depositing a layer of polysilicon above said gate insulation layer, said layer of polysilicon being deposited to a second target thickness such that said layer of metal of said determined first target thickness is substantially consumed and substantially all of said layer of polysilicon is consumed when said layer of metal is converted to a metal silicide layer on said gate electrode;
   patterning at least said layer of polysilicon to define said gate electrode;
   forming said source and drain regions in said substrate;
   depositing said layer of metal to said determined first target thickness on said gate electrode and said source and drain regions; and
   performing at least one heat treatment process to form said metal silicide layer on said source and drain regions and on said gate electrode.

36. The method of claim 35, wherein performing at least one heat treatment process comprises the sequence:
   performing a first rapid thermal anneal process to form a metal silicon compound in the gate electrode;
   removing non-reacted metal by a selective etch step; and
   performing a second rapid anneal process to convert the metal silicon compound into a metal silicide.

37. The method of claim 35, wherein said specified metal is at least one of a refractory metal and a Group VIII metal.

38. The method of claim 37, wherein said specified metal is at least one of tungsten, tantalum, molybdenum, titanium, cobalt, platinum, palladium, nickel and zirconium.

39. The method of claim 35, wherein a gate length of said gate electrode is in the range of approximately 0.25–0.04 µm.

40. The method of claim 39, wherein the gate length is in the range of approximately 0.1–0.04 µm.

41. The method of claim 35, further comprising forming a barrier layer on said gate insulation layer prior to depositing the polysilicon layer.

42. The method of claim 41, wherein said barrier layer is comprised of a material that has a reduced interaction activity with the metal silicide compared to an interaction activity of the gate insulation layer with the metal silicide.

43. The method of claim 41, wherein a dielectric constant of the barrier layer is higher than a dielectric constant of the gate insulation layer.

44. The method of claim 42, wherein said material comprises a metal.

45. The method of claim 42, wherein said material comprises at least one of titanium, tantalum, titanium nitride and tantalum nitride.

* * * * *